United States Patent
Olsen

(10) Patent No.: US 6,820,794 B2
(45) Date of Patent: Nov. 23, 2004

(54) SOLDERLESS TEST INTERFACE FOR A SEMICONDUCTOR DEVICE PACKAGE

(75) Inventor: Edward H. Olsen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 10/330,394

(22) Filed: Dec. 27, 2002

(65) Prior Publication Data

US 2003/0189083 A1 Oct. 9, 2003

Related U.S. Application Data

(60) Provisional application No. 60/343,757, filed on Dec. 29, 2001.

(51) Int. Cl.[7] .............................. B23K 1/00; G01R 31/00
(52) U.S. Cl. ....................... 228/103; 228/104; 324/500; 324/537
(58) Field of Search ................................ 228/103, 104, 228/8; 324/500–556, 750–772

(56) References Cited

U.S. PATENT DOCUMENTS

| | | | | |
|---|---|---|---|---|
| 3,859,711 A | * | 1/1975 | McKiddy ...................... 29/593 |
| 4,835,465 A | * | 5/1989 | Gergin ........................ 324/754 |
| 4,895,750 A | * | 1/1990 | Pratt .......................... 428/137 |
| 4,956,604 A | * | 9/1990 | Cedrone ...................... 324/754 |
| 5,109,596 A | * | 5/1992 | Driller et al. ................. 29/705 |
| 5,172,063 A | * | 12/1992 | Munikoti et al. ........... 324/537 |
| 5,234,149 A | * | 8/1993 | Katz et al. ............... 228/123.1 |
| 5,262,718 A | * | 11/1993 | Svendsen et al. ........... 324/754 |
| 5,323,105 A | * | 6/1994 | Davis et al. ................. 324/761 |
| 5,399,982 A | * | 3/1995 | Driller et al. ............... 324/754 |
| 5,451,885 A | * | 9/1995 | Birch et al. ................. 324/760 |
| 5,808,475 A | * | 9/1998 | Knauer et al. .............. 324/762 |
| 5,949,246 A | * | 9/1999 | Frankeny et al. ........... 324/765 |
| 5,971,253 A | * | 10/1999 | Gilleo et al. ........... 228/180.22 |
| 6,288,562 B1 | * | 9/2001 | Bellinghausen et al. .... 324/761 |
| 6,710,611 B2 | * | 3/2004 | Saulnier et al. ............. 324/755 |
| 2003/0189083 A1 | * | 10/2003 | Olsen .......................... 228/115 |

OTHER PUBLICATIONS

"Interconnection & Packaging Solutions", Aries Electronics, Inc., Short From Catalog, 6th Edition, Printed Jul. 1999 pp. 2–11.
"M&M Specialties, Inc. Data Sheet", Publicly available on the Internet at www.mmpec.com, 2nd Qtr. 2001, Issue 4, 3 pages.
"Our Product Offerings", Tecknit Interconnection Products, Datasheet, publicly available on the internet at www.fuzzbuttons.com/mainproducts.html. retrieved May 2, 2001, pp. 1–2.
"Fuzz Button Applications", Tecknit Interconnection Products, Datasheet, publicly available on the internet at www.fuzzbuttons.com/fuzzbuttonapp.html, retrieved May 2, 2001, pp. 1–2.
"Design Criteria", Tecknit Interconnection Products, Datasheet, publicly available on the internet at www.fuzzbuttons.com/criteria.html, retrieved May 2, 2001, pp. 1–4.
"All The BGA Socket Solutions You Will Every Need", Emulation Technology, Inc., Datasheet, publicly available prior to Jan. 2, 2002, 4 pages.

* cited by examiner

Primary Examiner—Kiley Stoner
(74) Attorney, Agent, or Firm—Wade James Brady, III; Frederick J. Telecky, Jr.

(57) ABSTRACT

A solderless test interface (10) includes a thin, flexible, electrically insulative sheet (20) having metal plated through-holes (24) formed in the pattern of the external ball contacts (54) of a semiconductor device (14). The termini (26, 30) of the holes (24) on the surface of the sheet (20) are also plated. The metal (40) is coated with a soft metal (42) which will cold-flow under force. The sheet is inserted between the ball contacts (54) and a test board (18). Force is applied to the test board and/or the device to engage and deform the soft metal (42) at the hole termini (26, 30) by its engagement with the balls (54) and pads (16) on the test board. The deformation ensures a low resistance electrical path between the balls and the pads during testing of the device.

7 Claims, 2 Drawing Sheets

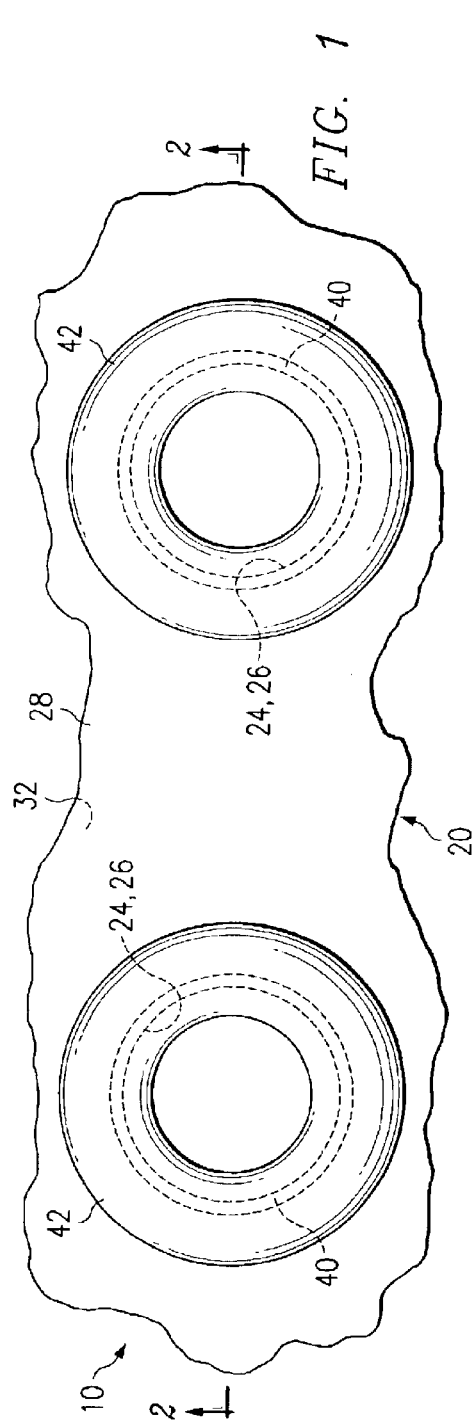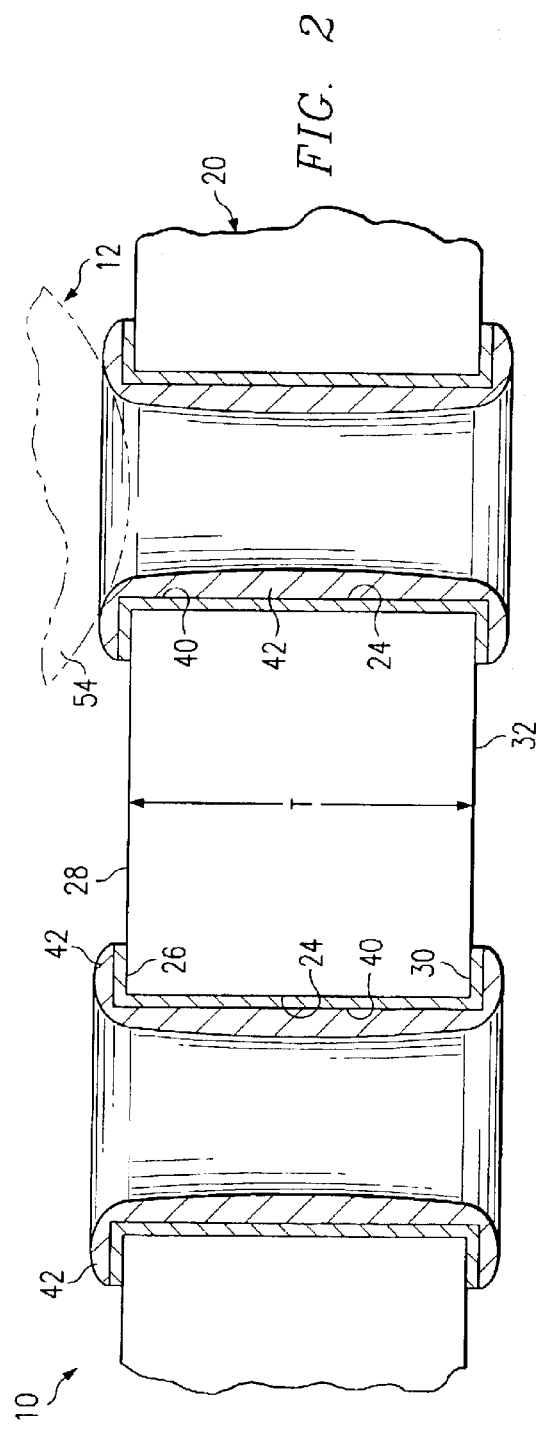

SOLDERLESS TEST INTERFACE FOR A SEMICONDUCTOR DEVICE PACKAGE

This application claims priority of U.S. provisional application Ser. No. 60/343,757 filed Dec. 29, 2001.

FIELD OF THE INVENTION

The present invention relates to a solderless test interface for a semiconductor device package, and, more particularly, to a temporary, very low electrical resistance, connection between the external contacts of a semiconductor device package and the conductive pads of a test board which permits accurate testing of the package.

BACKGROUND OF THE INVENTION

Numerous types and styles of semiconductor products are known wherein various semiconductor devices, integrated circuits and other miniature electrical items are electrically and physically associated in a package having external electrical contacts that are electrically continuous with the devices and circuits within the package. The external contacts permit the electrical connection of the package to a printed circuit (or wiring) board ("PCB") carrying other such packages or circuitry and other electrical devices to yield an operative utilization device, such as television chassis or an electrical assembly such as a computer motherboard. The popularity of small portable devices, such as audio players, personal information managers and cellular telephones, has required the design of new highly miniaturized package designs with high numbers of electrical contacts arranged in very dense patterns to conserve physical space. These newer package designs present unique challenges for making external electrical connection for PCB assembly and in particular, for electrical testing of the semiconductor device.

Before a packaged semiconductor device is incorporated into its use environment, it must be electrically tested. Typically, testing is effected by engaging conductive pads on a test board—which are connected to test circuitry—with the external contacts of the package. This engagement may be direct or indirect. Indirect engagement may be achieved by inserting the device package into a test socket where package external contacts engage with socket terminals of which are then engaged with the test pads. In the foregoing test techniques, electrical resistance at the contact-pad interface—or at the contact-plug/terminal-pad interface when a test socket is used—impedes current flow through the Device-Under-Test (DUT) and the test circuitry. This contact resistance is not a problem in many test situations, but may significantly hinder or prevent accurate testing of packages through which relatively high test currents must flow.

Specifically, in testing semiconductor packages that include certain types of low dropout ("LDO") regulators it has been found that the sum of the output impedance of a DUT and the contact resistance must be well below about 0.1 ohm. Electrical testing using indirect (test socket) engagement methods have been found to be unsatisfactory for testing LDOs as the relevant contact resistances cause the foregoing sum to far exceed 0.1 ohm which introduces measurement error of certain critical electrical parameters. Lowering of the contact resistance may be achieved by soldering the DUT's external contacts directly to the test board, but this requires soldering/de-soldering each DUT which quickly degrades the test board condition. Another method is to solder the DUT directly to a daughter board which then engages with the test board via a connector, but the contact resistance of the connector between such a board and the test board is unacceptably high. Either soldering method either consumes the package or necessitates costly de-soldering after test.

SUMMARY OF THE INVENTION

From the foregoing it may be seen that there exists a need for a technique that permits establishment of a very low electrical resistance connection between the external contacts of a semiconductor package and the conductive pads of a test board.

This need is abrogated by the present invention, which provides apparatus and methods for establishing a temporary low electrical resistance connection between the external contacts of a semiconductor device package and the conductive pads of a test board, so that contact-resistance-sensitive testing of LDOs and similarly sensitive devices may be accurately achieved.

The semiconductor device package may be a BGA, or ball grid array, package. The external contacts of a BGA package take the form of a pattern, grid or group of conductive balls on a surface of the package, although other external contacts are contemplated by the present invention.

The apparatus of the invention first comprises a thin, planar, flexible electrically insulative substrate. The substrate has formed therethrough a plurality of apertures. The pattern of the aperture termini or ends on one side of the substrate are congruent with the pattern of the package balls or other external contacts. As used herein, "congruent" means "coinciding when superimposed." The pattern of the aperture termini or ends on the other side of the substrate are congruent with the pattern of the conductive pads. When the device package and the test board are opposed so that the external contacts and the conductive pads face each other, the substrate is insertable therebetween to align the respective termini groups simultaneously align with the external contacts and the pads.

The apparatus also includes an electrically continuous, thin coating of a highly conductive metal on the wall of each aperture and on both surfaces of the substrate surrounding both termini of each aperture. The metal may be copper that is plated on the wall of each aperture and that assumes an annular pattern surrounding each aperture terminus. Any technique generally referred to as "through-hole plating" may be utilized. Any other metal or alloy that is highly conductive and can be plated or otherwise expeditiously deposited onto the substrate material may also be used.

The apparatus finally includes a soft metal layer on the coating. The metal, which may be tin-lead, or soft "bondable" gold, may be deposited on the thin metal coating by plating or functionally similar techniques. The soft metal is of a type that experiences cold flow deformation when minimal force is applied thereto. Specifically, the force is applied to the soft metal surrounding the aperture termini on one surface of the substrate by the external contacts or balls and to the soft metal surrounding the aperture termini on the other surface of the substrate by the pads. This force application occurs as the package and the test board are urged together. The cold flow deformation effects a very low electrical resistance engagement between the balls and the soft metal, on one hand, and the pads and the soft metal, on the other hand. In this way a very low electrical resistance path between the balls and the pads is established through the soft-metal-coated highly conductive metal coating.

More specifically the deformation of the soft metal into intimate conformity with the balls and the pads, resulted in less than 0.020 Ohms of contact resistance being introduced into the test circuit. The force necessary to urge the package and the test board together to achieve this effect is nominal.

The diameter of the aperture termini after the soft metal is deposited is preferable smaller than the diameter of the balls so that the balls may be said to be slightly "nested" in the apertures.

Since no permanent bond is formed between the substrate and the package, following testing, the package is removed for further processing or shipment and further packages are tested. If the forces utilized are sufficiently low, a given substrate may be re-used. Typically, however, the substrates, which are relatively inexpensive, are discarded after a single use.

The test board may include two or more guide posts which are received by guide holes formed through the substrate. In this way the substrate applicable to a given ball and pad configuration may be aligned with the pads on the test board and with the balls of a package to be tested.

The method according to the present invention includes the method of making the apparatus and the method of using same. Both are believed to be sufficiently clear from the foregoing description of the apparatus.

BRIEF DESCRIPTION OF THE DRAWING

FIG. 1 is a partial, magnified top view of a solderless test interface for a semiconductor package according to the principles of the present invention;

FIG. 2 is a partial sectioned side view of the test interface of FIG. 1 taken along line 2—2 in that Figure.

DETAILED DESCRIPTION

Figure 3:
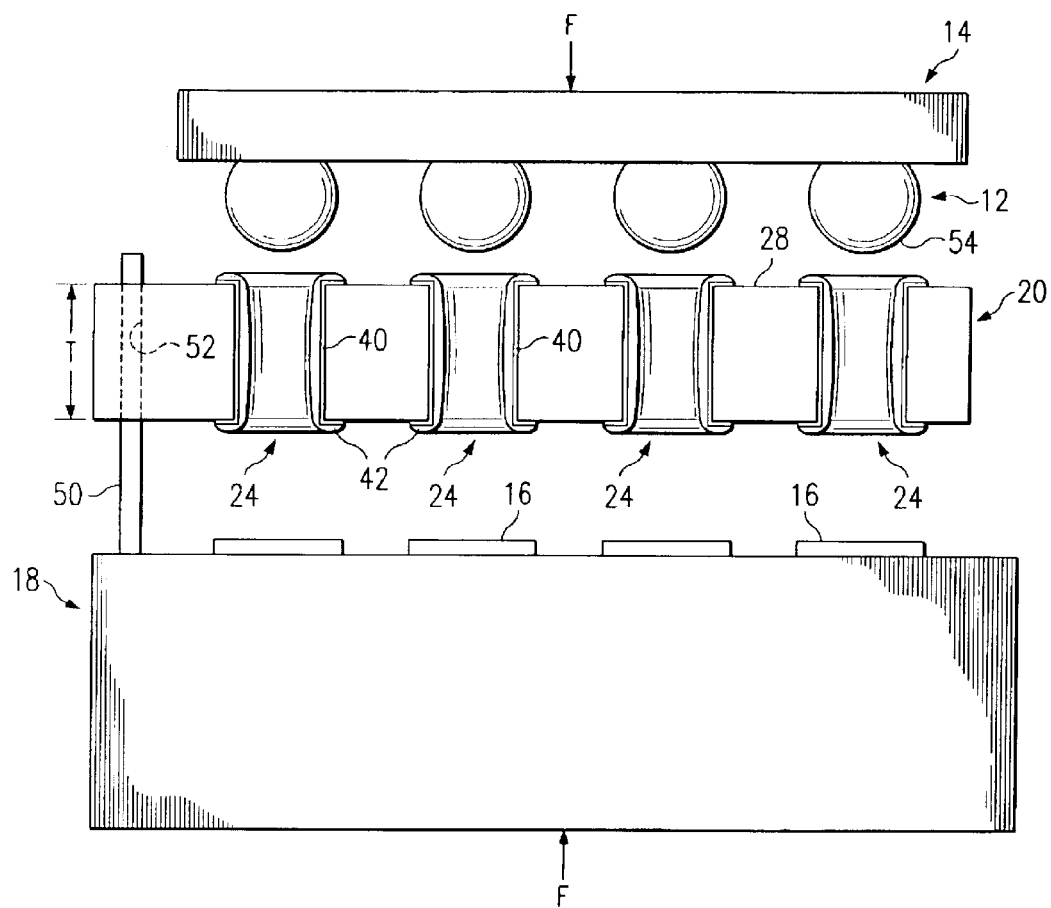
FIG. 3 is a side view of the test interface of the present invention in use to effect connection of a device package to a test board.

Referring first to FIGS. 1 and 2, there is shown a test interface 10 for temporarily establishing a very low electrical resistance connection between the external contacts 12 of a semiconductor device package 14 (see FIG. 3) and the opposed conductive pads 16 of a test board 18 (again, see FIG. 3).

The test interface 10 comprises a thin, flexible sheet or planar member 20 of an electrically insulative material such as fiber glass or plastic. The sheet 20 may have a thickness T of about 0.010 to 0.015 inch and is capable of having metal coated thereon, such as be electroless plating or electroplating.

Formed through the sheet 20 in a pattern or grid are plural apertures 24, only three of which are shown in FIGS. 1 and 2. The spacing between the apertures 24 and the shape of the aperture pattern is such that the pattern of the termini 26 of the apertures 24 on an upper surface 28 of the sheet 20 is congruent with and corresponds to the spacing and pattern of the external contacts 12 of the package 14. Similarly, the pattern of the termini 30 of the apertures 24 on a lower surface 32 of the sheet 20 is congruent with and corresponds to that of the pads 16 on the test board. As used herein, "congruent" means "coinciding when superimposed."

In preferred embodiments of the invention, the apertures 24 are generally normal to the surfaces 28 and 32. Accordingly, the pattern of the apertures 24, as well as the patterns of the external contacts 12 of the package 14 and the pads 16 of the test board 18 are mutually congruent. It should be understood that if the latter condition does not obtain, only the termini 26 and the contacts 12, on the one hand, and the termini 30 and the pads 16 will be congruent, while the apertures will not be normal to the surfaces 28,32.

A first, highly conductive metal or metal alloy layer 40 is applied to or deposited on the walls of the apertures 24 and portions of the surfaces 28 and 32 of the sheet 20 immediately surrounding the termini 26 and 30 of the apertures 24. Any expedient deposition technique such as electroless plating may be used to deposit the layer 40. A preferred metal is copper that is electrolessly plated to a thickness of 0.00025 to 0.0005 inch. The termini-surrounding portions of the first metal layer 40 may be, as shown, annular, but other configurations are possible, depending on the deposition technique used. The termini-surrounding portions of the layer 40 for a given aperture 24 are integral and electrically continuous with the portions of the layer 40 on the wall of the aperture 24. The termini-surrounding portions of the layers 40 of adjacent apertures 24 are electrically discontinuous and are sufficiently spaced apart to achieve that goal.

A second, electrically conductive, soft layer 42 of a metal or metal alloy which experiences cold flow or deformation when subjected to the application of mild force is deposited on at least the termini-surrounding portions of the first layer 40. Deposition may be achieved by electroless plating or by any other effective technique. In order to expedite the deposition of the layer 42, it may be preferred to deposit it on the entire first layer 40, both within, and on the walls of, the apertures 24 and on the termini-surrounding portions, as shown in the Figures. The second layer is deposited to a thickness of about 0.0002 to 0.002 inch, and may comprise a tin-lead alloy or other metals or alloys such as, Gold, "preferred", and silver.

In use, the test interface 10 is first inserted between the spaced-apart device package 14 and test board 18, as shown in FIG. 3, to align the apertures 24 with both the external contacts 12 of the package 14 and the pads 16 of the test board 18. This alignment effects the alignment of the termini-surrounding portions of the layers 40 and 42 on the upper surface 28 with the contacts 12 and on the lower surface 32 with the pads 16. The test board 18 may carry one or more alignment posts 50 which are received in complementary holes 52 of formed through the substrate 20 to effect this alignment.

As seen in FIG. 3, The package 14 may be a BGA ("ball grid array") package the external contacts 12 of which comprise conductive balls or spheres 54 of solder or other similar material by which the package 14 will ultimately be connected to circuitry or utilization devices. In the example of FIG. 3, the balls have nominal diameters of 0.012 inch.

Next, the package 14 and the test board 18 are moved relatively together—as indicated by one or more of the arrows denoted "F"—until the balls 54 engage the aligned termini-surrounding portions of the layer 42 on the surface 28 and the pads 16 engage the termini-surrounding portions of the layer 42 on the surface 32. Relative movement may be achieved by moving the package 14 toward the test board 18, by moving the test board 18 toward the package 14, or by moving both members 14,18 together. Once engagement is achieved, the application of force—again, indicated by the arrows "F"—to either or both members effects cold-flow deformation of the termini-surrounding portions of the layer 42 on both surfaces 28 and 32. Specifically, the balls 54 partly enter their respective apertures, and in so doing apply force to the termini-surrounding portions of the second layer 42 on the surface 28. This force causes the soft metal of the layer 42 to deform and cold flow so as to be in intimate surface contact and engagement with the balls 54. This intimate engagement effects a very low electrical resistance contact between the second layer 42 and it respective ball 54.

Similarly, applied force causes the pads 16 to achieve intimate, low electrical resistance contact with the termini-surrounding portions of the second layer 42 on the surface 32. Accordingly, their now exists between the balls 54 and the pads 16 a low electrical resistance path by which critical devices—such as LODs, as discussed earlier—comprising or in the package 14 may be accurately tested.

In typical applications, the apertures have an initial diameter of 0.010 inch and, after deposition of the first layer 40, a diameter of 0.0095 inch. The diameter of the annular termini-surrounding portions of the first layer 40 is 0.014 inch. The soft metal layer 42 is deposited on the first layer 40 to a thickness of 0.0002 to 0.002 inch.

The voltage drop across the ball-pad 54–16 path using the test interface 10 of the invention, with the elements thereof having the dimensions set forth above, was measured at 0.012 volt. This was substantially lower than the same measurement taken during the use of solder-connected daughter board (0.017 volt, 41% higher), a Yokowa socket (0.035 volt, 290% higher) and a Loranger socket (0.060 volt, 500% higher).

In view of the low cost of the test interface 10 of the present invention, it may be discarded following its use. Typical test interfaces 10 of the type disclosed herein may be produced at a nominal cost of about $2.00 to $5.00.

Although the balls 54 are typical external contacts 12, the test interface 10 may be used with any type of device or package 14 having external contacts 12 capable of exerting sufficient force to deform the material of the layer 42 without damaging the contacts 12.

While various aspects and embodiments of the present invention are described herein, it is understood that the invention hereof is limited by the following claims, which shall cover the apparatus and method disclosed and equivalents thereof.

What is claimed is:

1. A method of establishing a temporary, very low electrical resistance connection between external contacts of a semiconductor device package and conductive pads of a test board, which comprises:

inserting a thin, planar, flexible, electrically insulative substrate having apertures therethrough, between the facing contacts and pads, when the device package and the test board are opposed; the pattern of the aperture termini on one side of the substrate being congruent with the pattern of the contacts, and the pattern of the aperture termini on the other side of the substrate being congruent with the pattern of the conductive pads; a first, electrically continuous thin layer of a highly conductive metal being deposited on the wall of each aperture and on both surfaces of the substrate surrounding the termini of each aperture; a second, electrically conductive, soft metal layer being deposited on at least the termini-surrounding portions of the first layer;

aligning the respective termini groups with the contacts and the pads; and urging the package and the test board together with sufficient force to deform the soft metal by cold flow deformation effected by the contacts and the pads thereagainst to establish a very low electrical resistance path between the balls and the pads through the deformed portions of the second layer and through the first layer.

2. A method of establishing a temporary, very low electrical resistance connection between the balls of a BGA semiconductor device and opposed conductive pads of a test board, which comprises:

inserting between the device and the board a flexible, thin, electrically insulative substrate having therethrough plural apertures each aligned with a respective ball-pad pair and carrying on the aperture walls and on the substrate surfaces surrounding the aperture termini a soft metal layer which experiences cold flow in those regions of the layer surrounding the aperture termini when a force is applied to such regions; and applying sufficient force to the device and the board to effect sufficient cold flow of the regions engaged by the balls and the pads to effect a very low resistance electrical path therebetween.

3. A method of making a solderless test interface for establishing a temporary, very low electrical resistance connection between external contacts of a semiconductor device package and conductive pads of a test board, which comprises:

forming apertures through a thin, planar, flexible, electrically insulative substrate, the pattern of the aperture termini on one side of the substrate being congruent with the pattern of the contacts, and the pattern of the aperture termini on the other side of the substrate being congruent with the pattern of the conductive pads, the substrate being insertable between the facing contacts and pads, when the device package and the test board are opposed, in order to align the respective termini groups with the contacts and the pads;

depositing a first, electrically continuous thin layer of a highly conductive metal on the wall of each aperture and on both surfaces of the substrate surrounding the termini of each aperture; and depositing a second, electrically conductive, soft metal layer on at least the termini-surrounding portions of the first layer; and applying a force against the soft metal layer, the soft metal experiencing cold flow deformation when the force is applied to such portions by the contacts and the pads while the substrate is inserted between the device and the board as they are urged together to establish a very low electrical resistance path between the balls and the pads through the deformed portions of the second layer and through the first layer.

4. A method of making a solderless test interface for establishing a temporary, very low electrical resistance connection between external contacts of a semiconductor device package and conductive pads of a substrate, which comprises the steps of:

providing a substrate having conductive pads thereon;

providing a semiconductor device having external contacts thereon;

providing a flexible sheet between said substrate and said semiconductor device facing said conductive pads and said external contacts, said flexible sheet having an electrically conductive material extending therethrough which experiences cold flow deformation when subjected to the application of a mild force, said electrically conductive material aligned with said conductive pads and said external contacts; and applying said mild force to at least one of said substrate or semiconductor device to move said semiconductor device and said substrate against said flexible sheet and cause flow or deformation of said electrically conductive material.

5. The method of claim 4 wherein said electrically conductive material is at least one of tin-lead alloy and alloys of gold and silver.

6. The method of claim 4 further including the step of applying balls as said conductive pads.

7. The method of claim 5 further including the step of applying balls as said conductive pads.

* * * * *